(12) United States Patent
Foote (10) Patent No.: US 7,879,694 B1
(45) Date of Patent: Feb. 1, 2011

(54) SYSTEM AND METHOD FOR APPLYING A PRE-GATE PLASMA ETCH IN A SEMICONDUCTOR DEVICE MANUFACTURING PROCESS

(75) Inventor: Richard W. Foote, Kennedale, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 464 days.

(21) Appl. No.: 12/082,776

(22) Filed: Apr. 14, 2008

Related U.S. Application Data (63) Continuation-in-part of application No. 10/890,377, filed on Jul. 13, 2004, now abandoned.

(51) Int. Cl.
*H01L 21/322* (2006.01)
*H01L 21/00* (2006.01)

(52) U.S. Cl. .................. 438/474; 438/589; 438/710; 438/715; 438/798

(58) Field of Classification Search .................. None
See application file for complete search history.

(56) References Cited

U.S. PATENT DOCUMENTS

| | | | |
|---|---|---|---|
| 4,897,154 A | 1/1990 | Chakravarti et al. | |
| 4,929,566 A | 5/1990 | Beitman | |
| 5,296,411 A | 3/1994 | Gardner et al. | |
| 5,316,981 A | 5/1994 | Gardner et al. | |
| 5,498,577 A | 3/1996 | Fulford, Jr. et al. | |
| 5,538,923 A | 7/1996 | Gardner et al. | |
| 5,728,621 A | 3/1998 | Zheng et al. | |
| 6,107,143 A | 8/2000 | Park et al. | |
| 6,130,467 A | 10/2000 | Bandyopadhyay et al. | |
| 6,165,854 A | 12/2000 | Wu | |
| 6,187,649 B1 | 2/2001 | Gau | |
| 6,214,697 B1 | 4/2001 | Moore et al. | |
| 6,251,748 B1 | 6/2001 | Tsai | |
| 6,527,968 B1 | 3/2003 | Wang et al. | |
| 6,642,124 B1 | 11/2003 | Yamauchi | |
| 6,653,200 B2 | 11/2003 | Olsen | |
| 6,661,043 B1 | 12/2003 | Huang et al. | |
| 6,774,007 B2 | 8/2004 | Liu et al. | |
| 6,808,980 B2 | 10/2004 | Chen et al. | |
| 6,905,943 B2 | 6/2005 | DeLoach et al. | |
| 7,018,482 B1 | 3/2006 | Geomini | |
| 7,045,422 B2 | 5/2006 | Enders et al. | |
| 7,208,369 B2 | 4/2007 | Pai et al. | |
| 2002/0013025 A1 | 1/2002 | Wylle | |
| 2002/0093041 A1 | 7/2002 | Hong | |
| 2003/0071321 A1 | 4/2003 | Hong | |
| 2003/0173333 A1 | 9/2003 | Wang et al. | |
| 2003/0201473 A1 | 10/2003 | Liu et al. | |
| 2004/0108533 A1 | 6/2004 | Chen et al. | |
| 2004/0262697 A1 | 12/2004 | Enders et al. | |
| 2005/0056885 A1 | 3/2005 | Pai et al. | |

*Primary Examiner*—David E Graybill (57) ABSTRACT

A system and method is described for applying a pre-gate plasma etch in a semiconductor device manufacturing process in order to increase the integrity of a subsequently grown gate oxide layer. During the manufacture of a semiconductor device a sacrificial oxide layer is grown over a silicon substrate. The pre-gate plasma etch process is applied to the sacrificial oxide layer. Then the sacrificial oxide layer is stripped away and a gate oxide layer is grown over the silicon substrate. The gate oxide layer has an increased integrity due to the application of the pre-gate plasma etch process.

22 Claims, 12 Drawing Sheets

SYSTEM AND METHOD FOR APPLYING A PRE-GATE PLASMA ETCH IN A SEMICONDUCTOR DEVICE MANUFACTURING PROCESS

CROSS REFERENCE TO RELATED APPLICATION

The present patent application is a continuation-in-part that claims priority under 35 U.S.C. §120 to U.S. patent application Ser. No. 10/890,377 filed on Jul. 13, 2004, now abandoned which is incorporated herein by reference.

TECHNICAL FIELD OF THE INVENTION

The present invention is generally directed to manufacturing technology for semiconductor circuits and, in particular, to a system and method for applying a pre-gate plasma etch during a semiconductor device manufacturing process.

BACKGROUND OF THE INVENTION

In the manufacture of semiconductor devices shallow trench isolation (STI) is a well-known technique for isolating individual devices in a semiconductor integrated circuit. Shallow trench isolation often creates structures in which a "step down" occurs where the active silicon ends and the shallow trench begins. The "step down" is from the active silicon to the material that is used to fill the shallow trench. The material that is used to fill the trench is usually deposited silicon dioxide.

In prior art metal oxide semiconductor (MOS) devices when a layer of gate poly steps over the "step down" location, it has been noted that problems arise with the integrity of an underlying gate oxide layer. Therefore, there is a need in the art for a system and method that is capable of increasing the integrity of a gate oxide layer during a manufacturing process of a semiconductor device. In particular, there is a need in the art for a system and method that is capable of increasing the integrity of an underlying gate oxide layer near a "step down" location of a shallow trench structure in a semiconductor device.

SUMMARY OF THE INVENTION

To address the above-discussed deficiencies of the prior art, it is a primary object of the present invention to provide a system and method for increasing the integrity of a gate oxide layer during a manufacturing process of a semiconductor device.

In one advantageous embodiment of the method of the invention a sacrificial oxide layer is grown over a silicon substrate. Then a pre-gate plasma etch process is applied to the sacrificial oxide layer. The pre-gate plasma etch process is capable of etching silicon and silicon nitride but not silicon dioxide. Then the sacrificial oxide layer is stripped away from the silicon substrate. Then the gate oxide layer is grown over the silicon substrate. The previous application of the pre-gate plasma etch increases the integrity of the gate oxide layer.

It is an object of the present invention to provide a system and method for increasing the integrity of a gate oxide layer during a manufacturing process of a semiconductor device.

It is also an object of the present invention to provide a system and method for applying a pre-gate plasma etch to a sacrificial oxide layer during a manufacturing process of a semiconductor device.

It is yet another object of the present invention to provide a system and method for increasing the integrity of a gate oxide layer by reducing stress in the gate oxide layer.

It is still another object of the present invention to provide a system and method for increasing the integrity of a gate oxide layer by removing contaminating elements located within or near the gate oxide layer.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 20, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor device.

To simplify the drawings the reference numerals from previous drawings may sometimes not be repeated for structures that have already been identified.

Figure 1:
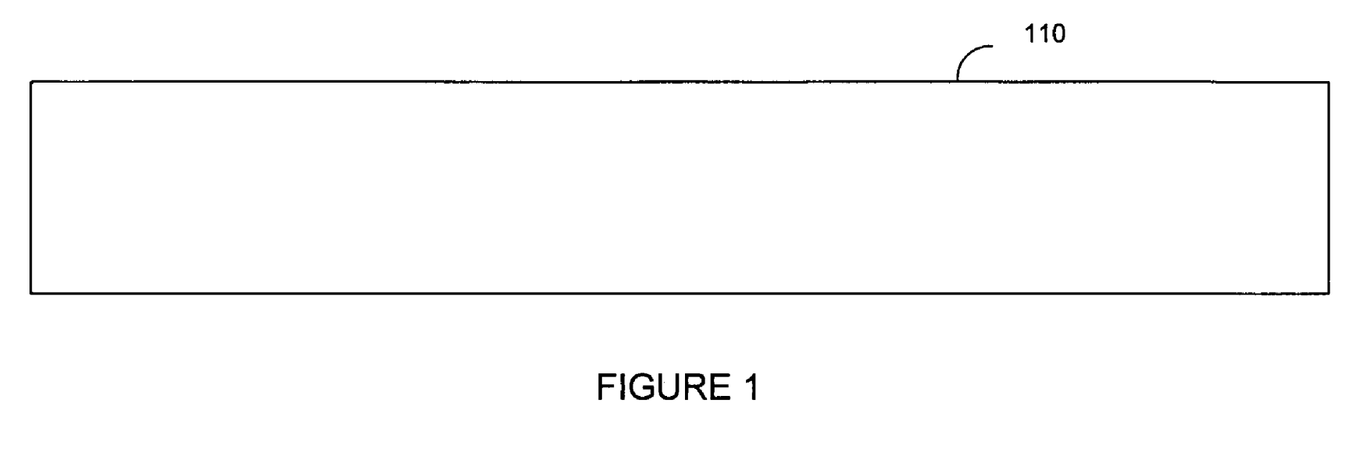
FIG. 1 illustrates a cross sectional view of a substrate comprising an active silicon layer for use in manufacturing a semiconductor device according to the principles of the present invention.
Figure 2:
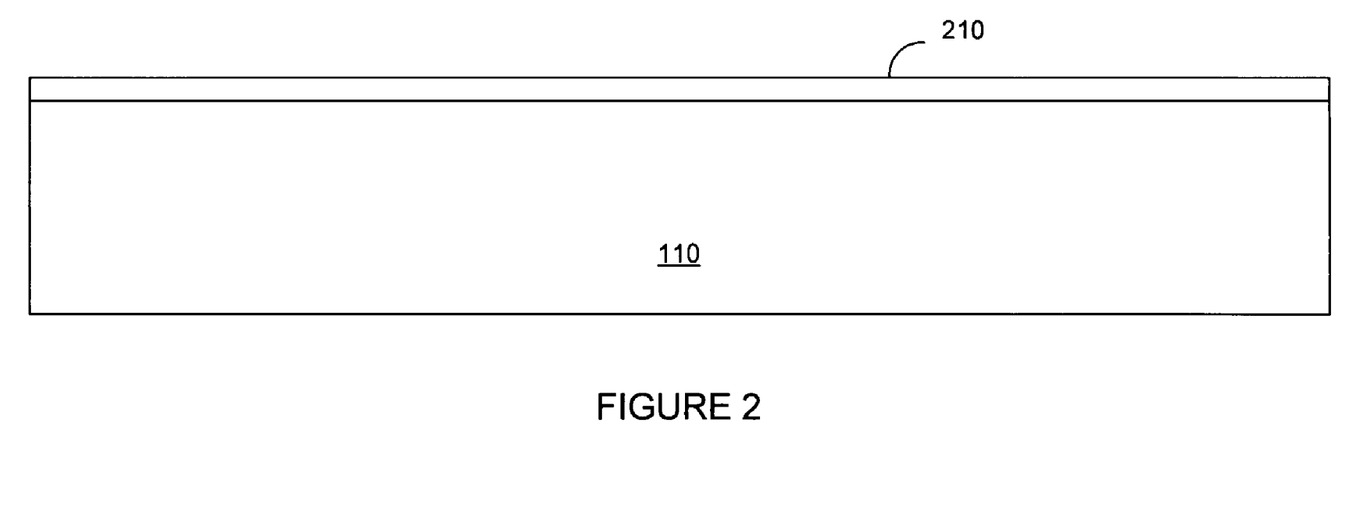
FIG. 2 illustrates the result of growing a pad oxide over the silicon substrate shown in FIG. 1.

FIG. 1 illustrates a cross sectional view of a substrate 110 comprising an active silicon layer for use in manufacturing a metal oxide semiconductor (MOS) device according to the principles of the present invention. FIG. 2 illustrates the next step of the manufacturing process in which a pad oxide layer 210 is grown over the silicon substrate 110. In an advantageous embodiment of the invention the thickness of the pad oxide layer 210 is approximately two hundred fifty Angstroms (250 Å). An Angstrom is equal to one ten thousandth ($10^{-4}$) of a micron and a micron (µm) is equal to one millionth of a meter (µm=$10^{-6}$ m). Therefore, an Angstrom is equal to $10^{10}$ meter.

The thickness of the pad oxide layer 210 is not drawn to scale in FIG. 2. The thickness of pad oxide layer 210 in FIG. 2 is drawn larger than actual size for purposes of clarity in reading the drawing. The thicknesses of other layers of material to be described later in this patent document may also be similarly drawn larger than actual size for purposes of clarity.

Figure 3:
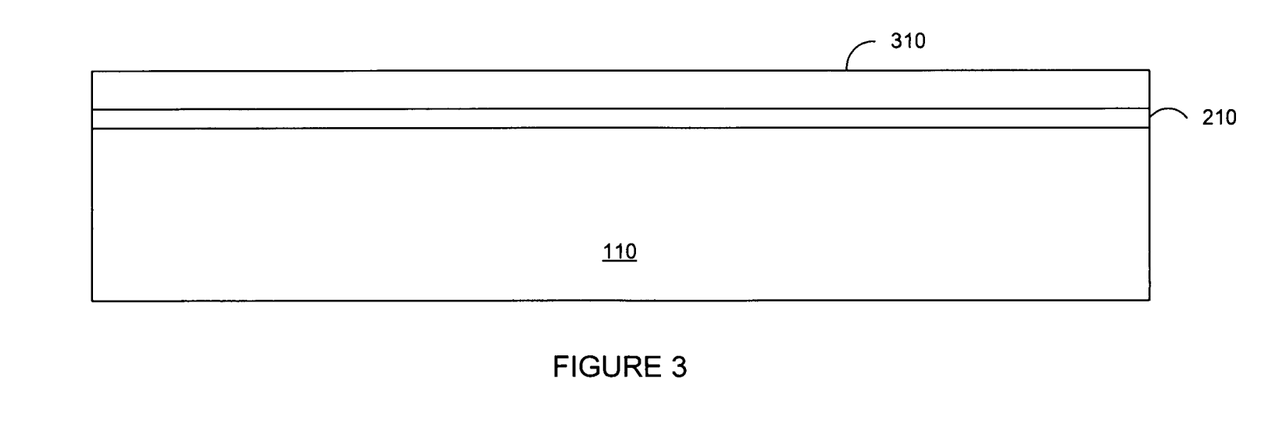
FIG. 3 illustrates the result of depositing a layer of silicon nitride over the pad oxide layer shown in FIG. 2.

FIG. 3 illustrates the next step of the manufacturing process in which a silicon nitride layer 310 is deposited over the pad oxide layer 210. In an advantageous embodiment of the invention the thickness of the silicon nitride layer 310 is approximately one thousand eight hundred fifty Angstroms (1,850 Å).

Figure 4:
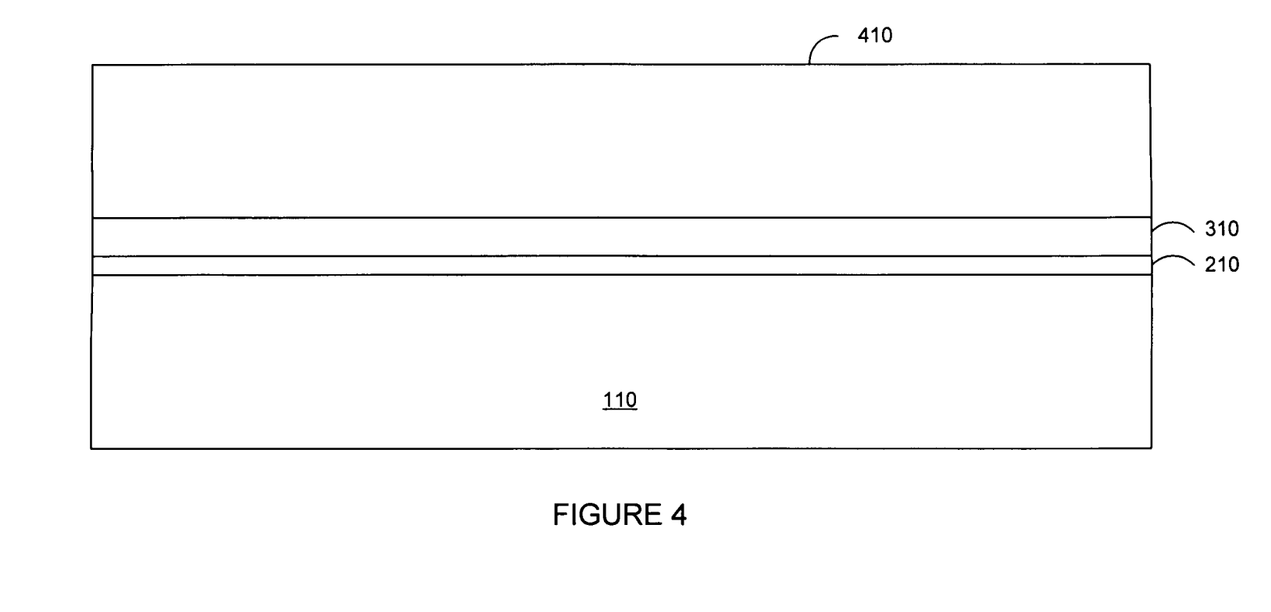
FIG. 4 illustrates the result of depositing a layer of photoresist over the silicon nitride layer shown in FIG. 3.

FIG. 4 illustrates the next step of the manufacturing process in which a photoresist layer 410 is deposited over the silicon nitride layer 310. In an advantageous embodiment of the invention the thickness of the photoresist layer 410 is approximately eleven thousand eight hundred Angstroms (11,800 Å).

Figure 5:
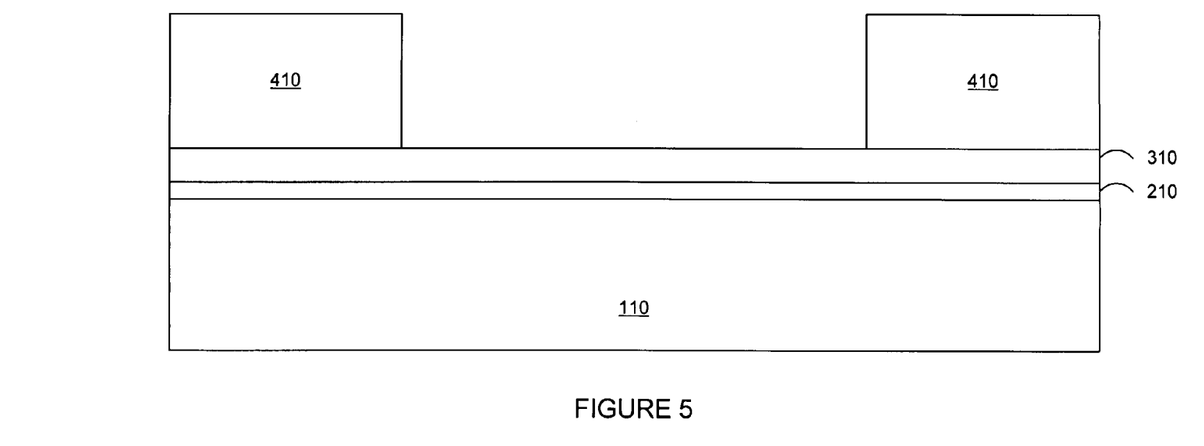
FIG. 5 illustrates the result of masking and exposing a central portion of the photoresist layer shown in FIG. 4.

FIG. 5 illustrates the next step of the manufacturing process in which a central portion of the photoresist layer 410 is masked and exposed to remove the central portion of the photoresist layer 410. The photoresist mask used to perform the masking process is not shown. The removal of the central portion of the photoresist layer 410 exposes the upper surface of the silicon nitride layer 310 as shown in FIG. 5.

Figure 6:
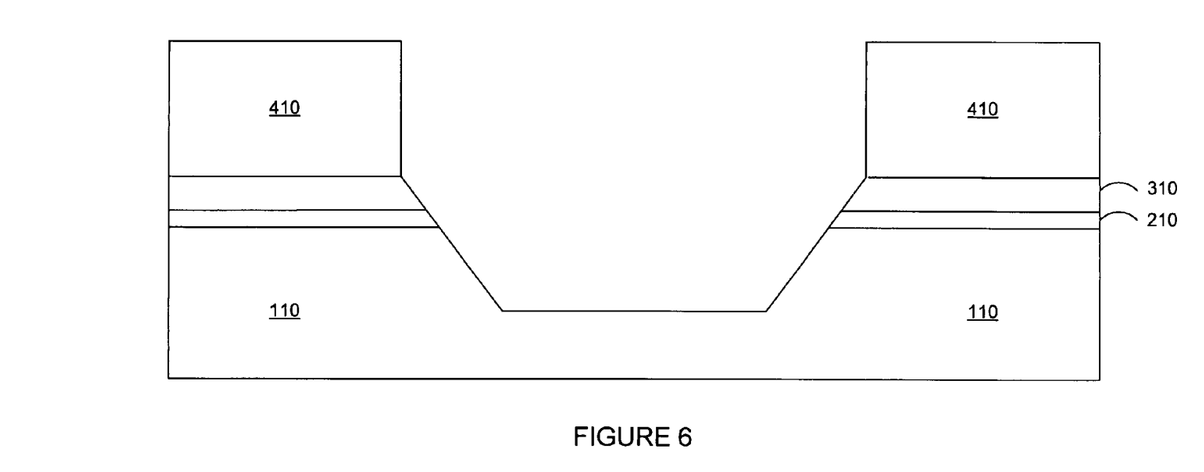
FIG. 6 illustrates the result of plasma etching a shallow trench through the silicon nitride layer and through the pad oxide layer and into the silicon substrate shown in FIG. 5.

FIG. 6 illustrates the result of the next step of the manufacturing process. A plasma etch process is applied to etch a shallow trench through the silicon nitride layer 310 and through the pad oxide layer 210 and into the silicon substrate 110. Appropriate chemicals are used to etch the various layers. Some of the photoresist material 410 is also removed during the plasma etch process.

Figure 7:
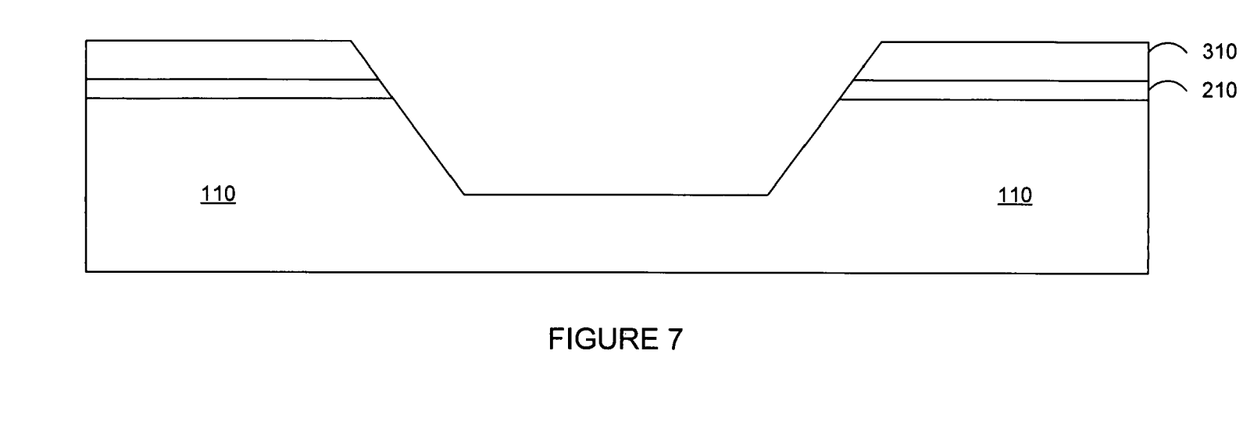
FIG. 7 illustrates the result of removing the remaining photoresist layer shown in FIG. 6.

FIG. 7 illustrates the result of the next step of the manufacturing process. The remaining photoresist layer 410 over the silicon nitride layer 310 is removed. At this stage an optional deep trench mask and etch process may be performed. The optional deep trench mask and etch process is not shown in FIG. 7. An optional channel stop mask and implant process may also be performed at this stage. The optional channel stop mask and implant process is also not shown in FIG. 7.

Figure 8:
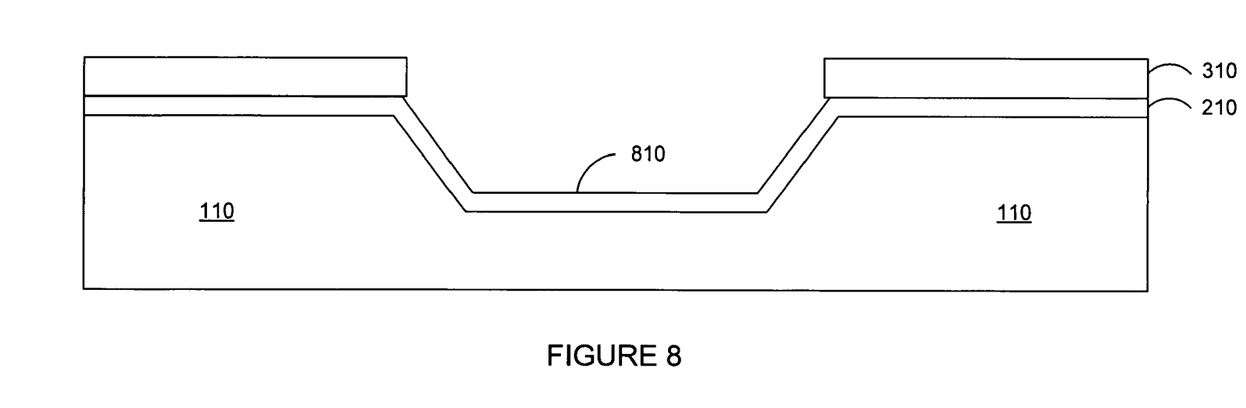
FIG. 8 illustrates the result of growing a liner oxide layer over the surfaces of the shallow trench shown in FIG. 7.

FIG. 8 illustrates the result of the next step of the manufacturing process. A liner oxide layer 810 is grown over the surfaces of the silicon substrate 110 of the shallow trench shown in FIG. 7. In an advantageous embodiment of the invention the thickness of the liner oxide layer 810 is approximately six hundred fifty Angstroms (650 Å).

Figure 9:
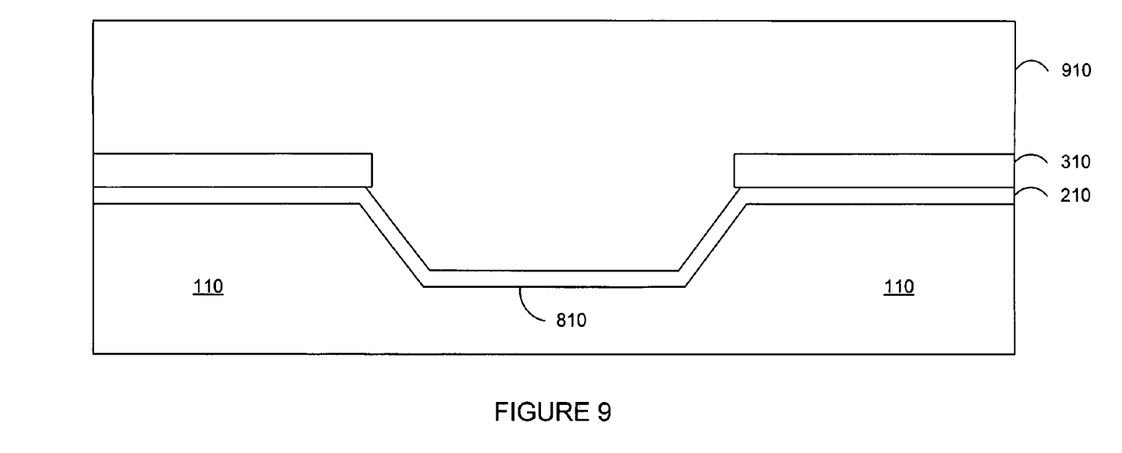
FIG. 9 illustrates the result of depositing a layer of tetra-ethyl-oxysilane (TEOS) trench fill material over the shallow trench structure shown in FIG. 8.

FIG. 9 illustrates the result of the next step of the manufacturing process. A layer of tetra-ethyl-oxysilane (TEOS) 910 is deposited over the shallow trench structure shown in FIG. 8. In an advantageous embodiment of the invention the thickness of the TEOS layer 910 is approximately nineteen thousand Angstroms (19,000 Å). At this stage an optional reverse trench mask and etch process may be performed. The optional reverse trench mask and etch process is not shown in FIG. 9.

Figure 10:
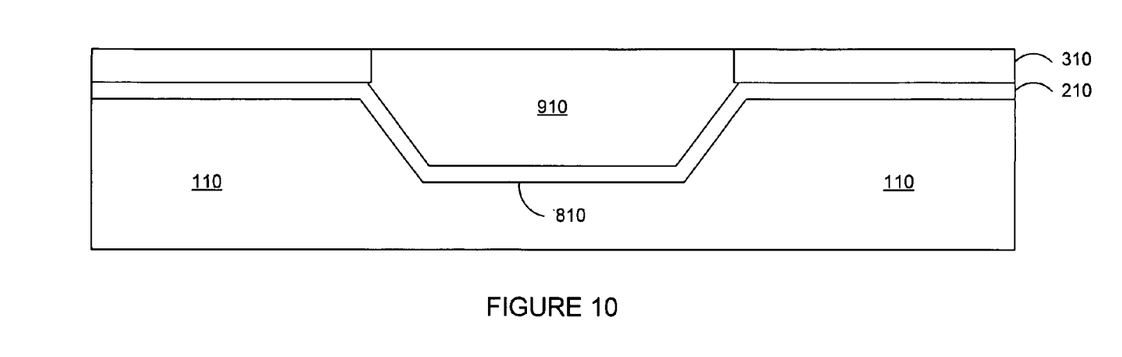
FIG. 10 illustrates the result of applying chemical mechanical polishing (CMP) to the TEOS trench fill material shown in FIG. 9 down to the level of the upper surface of the silicon nitride layer.

FIG. 10 illustrates the result of the next step of the manufacturing process. A chemical mechanical polishing (CMP) process is applied to the TEOS layer 910 shown in FIG. 9. The polishing process removes the TEOS layer 910 down to the level of the upper surface of the silicon nitride layer 310.

Figure 11:
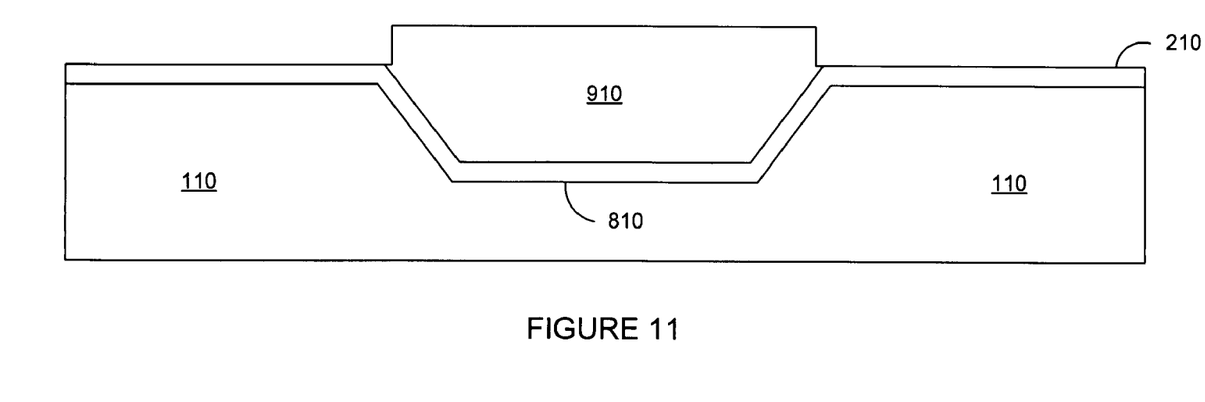
FIG. 11 illustrates the result of removing the silicon nitride layer shown in FIG. 10 with an etch that is selective to oxide.

FIG. 11 illustrates the result of the next step of the manufacturing process. An etch process is applied that is selective to oxide (e.g., an application of hot phosphoric acid). The etch process etches away the silicon nitride layer 310 down to the level of the upper surface of the pad oxide layer 210.

Figure 12:
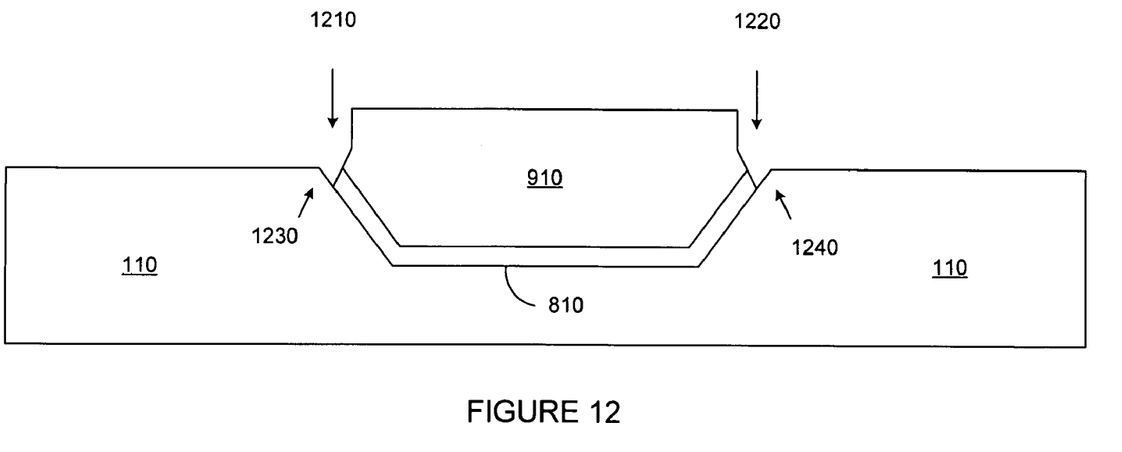
FIG. 12 illustrates the result of removing the oxide layer shown in FIG. 11 with an etch that is selective to silicon.

FIG. 12 illustrates the result of the next step of the manufacturing process. An etch process is applied that is selective to silicon (e.g., an application of hydrofluoric acid). The etch process etches away the exposed areas of pad oxide layer 210 down to the level of the upper surface of the silicon substrate 110. The liner oxide 810 and the TEOS trench fill material 910 are exposed to the acid etch at the side as well as at the top.

The application of the acid etch process creates notches (1210 and 1220) when the liner oxide 810 at the trench edge is etched away due to exposure to the acid. The corners (1230 and 1240) of the silicon substrate 110 that are created by the notches (1210 and 1220) contribute to several problems. These problems will be discussed more fully below.

Figure 13:
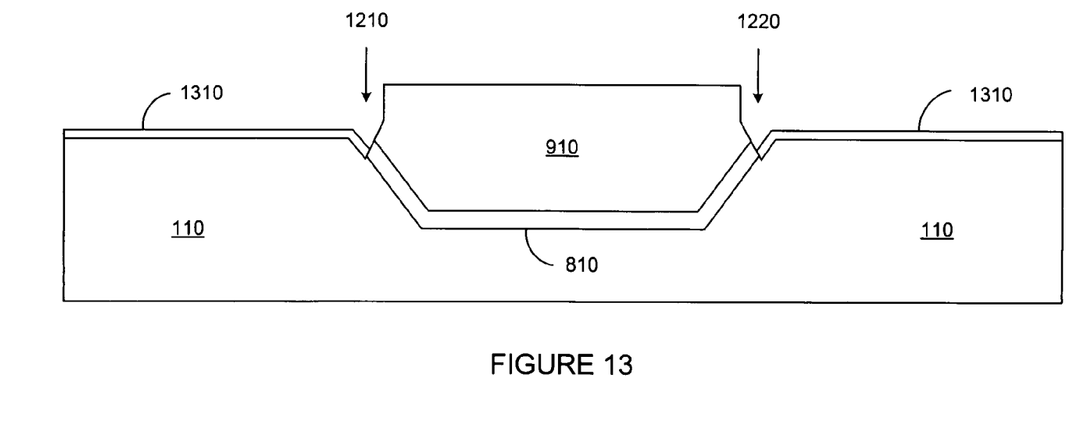
FIG. 13 illustrates the result of growing a sacrificial oxide layer over the silicon shown in FIG. 12.

FIG. 13 illustrates the result of the next step of the manufacturing process. A sacrificial oxide layer 1310 is grown over the silicon substrate 110. The sacrificial oxide layer 1310 partially fills in notch 1210 and notch 1220. Well mask and implants and drives that are created at this stage are not shown in FIG. 13. At this stage an optional threshold adjust mask and implant process may be performed. The optional threshold adjust mask and implant process is not shown in FIG. 13.

Figure 14:
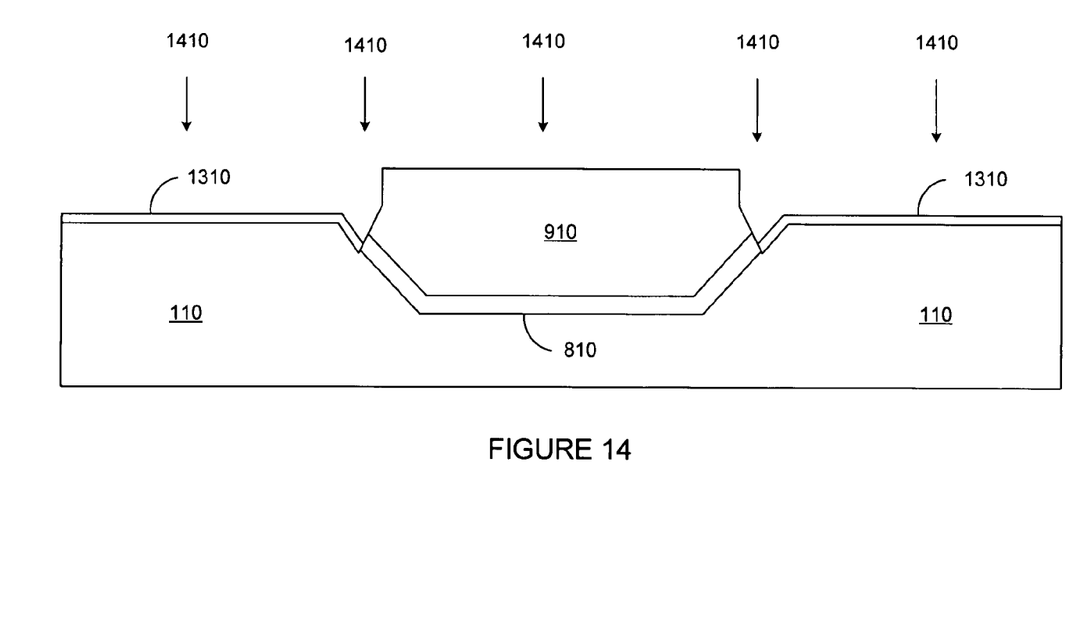
FIG. 14 illustrates the application of a pre-gate plasma etch process to the structure shown in FIG. 13.

FIG. 14 illustrates the next step of the manufacturing process. A pre-gate plasma etch process 1410 is applied to the structure shown in FIG. 13. The pre-gate plasma etch 1410 process is represented by the arrows designated with reference numeral 1410. Pre-gate plasma etch process 1410 is capable of etching silicon nitride and silicon but is selective to silicon dioxide (i.e., does not substantially etch silicon dioxide). The pre-gate plasma etch process 1410 etches silicon nitride approximately thirteen (13) times faster than it etches that it etches silicon dioxide. The pre-gate plasma etch process 1410 etches silicon approximately eighty (80) times faster than it etches that it etches silicon dioxide. Therefore, the pre-gate plasma etch process 1410 does not substantially etch silicon dioxide compared to the etch rate for silicon nitride and compared to the etch rate for silicon. The application of the pre-gate plasma etch process 1410 at this stage significantly improves the ultimate integrity of a layer of gate oxide that will be subsequently applied.

Figure 15:
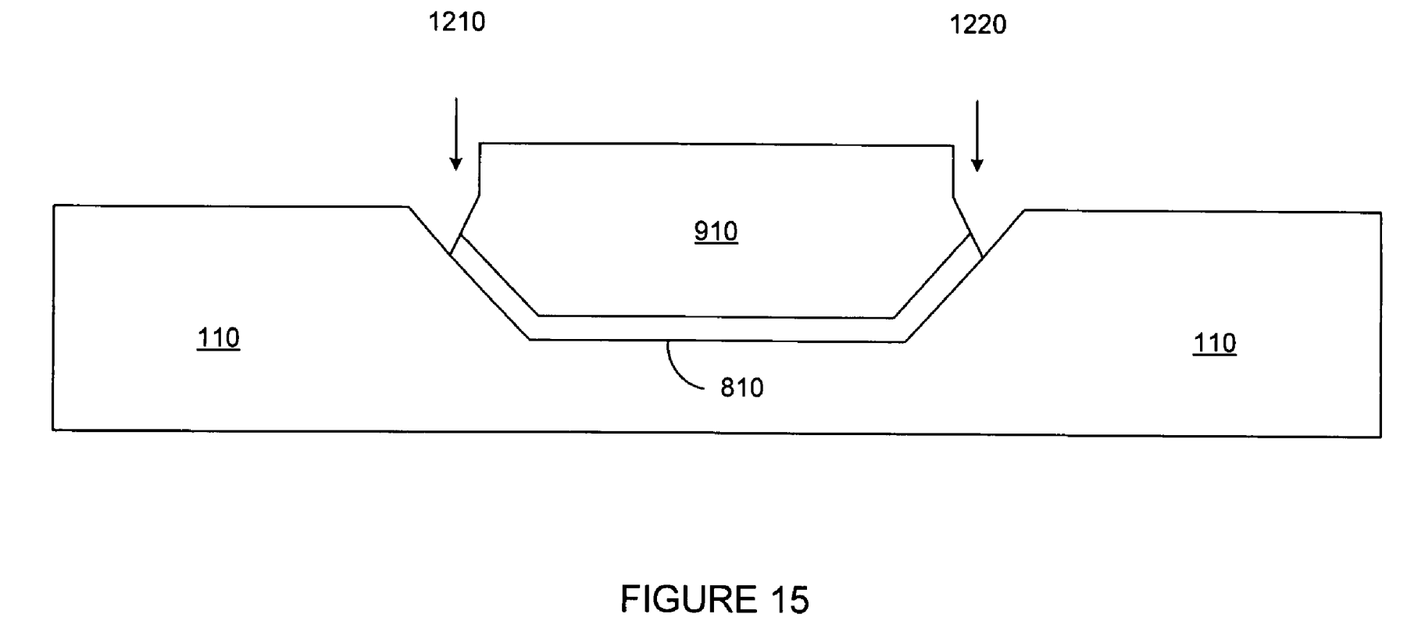
FIG. 15 illustrates the result of stripping off the sacrificial oxide layer shown in FIG. 14.

FIG. 15 illustrates the result of the next step of the manufacturing process. The sacrificial oxide layer 1310 is stripped away. The removal of the sacrificial oxide layer 1310 exposes the underlying silicon substrate 110. The stripping away of the sacrificial oxide layer 1310 causes both notch 1210 and notch 1220 to become deeper as shown in FIG. 15.

Figure 16:
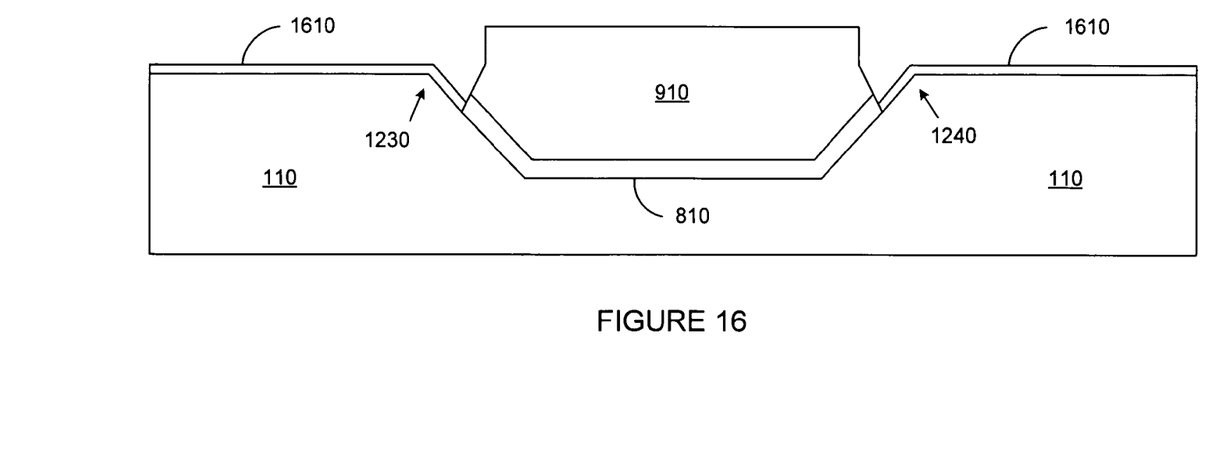
FIG. 16 illustrates the result of growing a gate oxide layer over the silicon shown in FIG. 15.

FIG. 16 illustrates the result of the next step of the manufacturing process. A gate oxide layer 1610 is grown over the silicon substrate 110. The gate oxide layer 1610 covers the corner 1230 and the corner 1240 of the silicon substrate 110 as shown in FIG. 16. In an advantageous embodiment of the invention the thickness of the gate oxide layer 1610 is approximately one hundred fifty Angstroms (150 Å).

Figure 17:
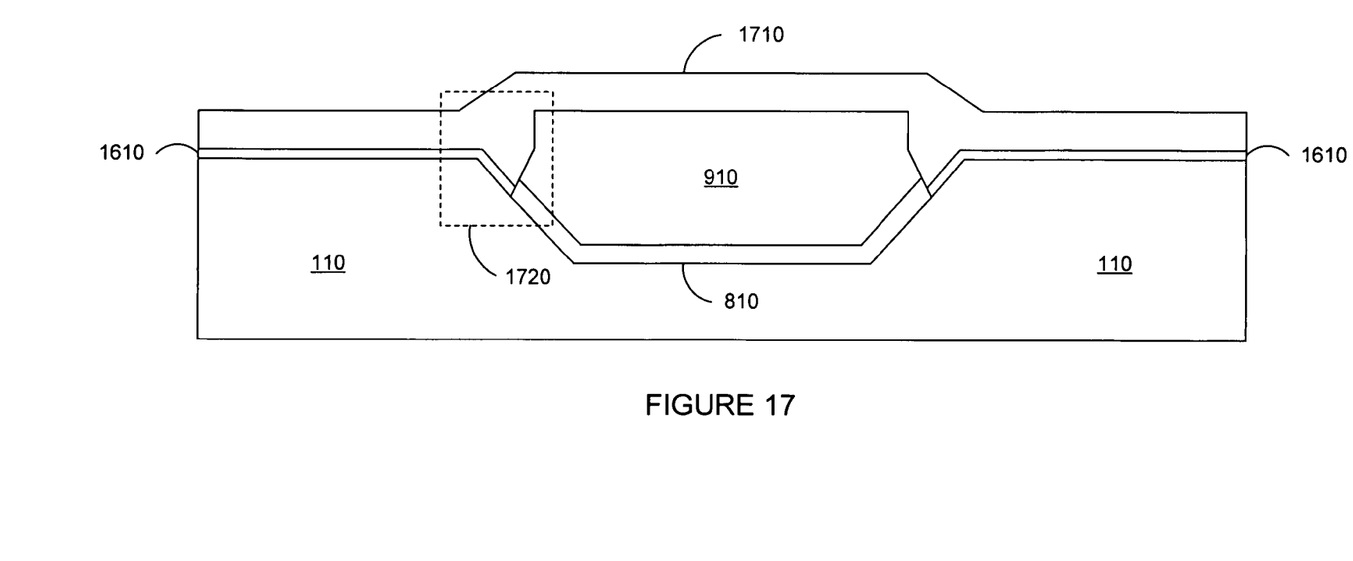
FIG. 17 illustrates the result of depositing a layer of polysilicon over the gate oxide layer and over the TEOS trench fill material shown in FIG. 16.

FIG. 17 illustrates the result of the next step of the manufacturing process. A layer of polysilicon 1710 is deposited over the gate oxide layer 1610 and over the TEOS trench fill material 910. In an advantageous embodiment of the invention the thickness of the polysilicon layer 1710 is approximately three thousand Angstroms (3,000 Å). At this stage an optional merged poly process to enable poly emitters may be performed. The optional merged poly process is not shown in FIG. 17.

Figure 18:
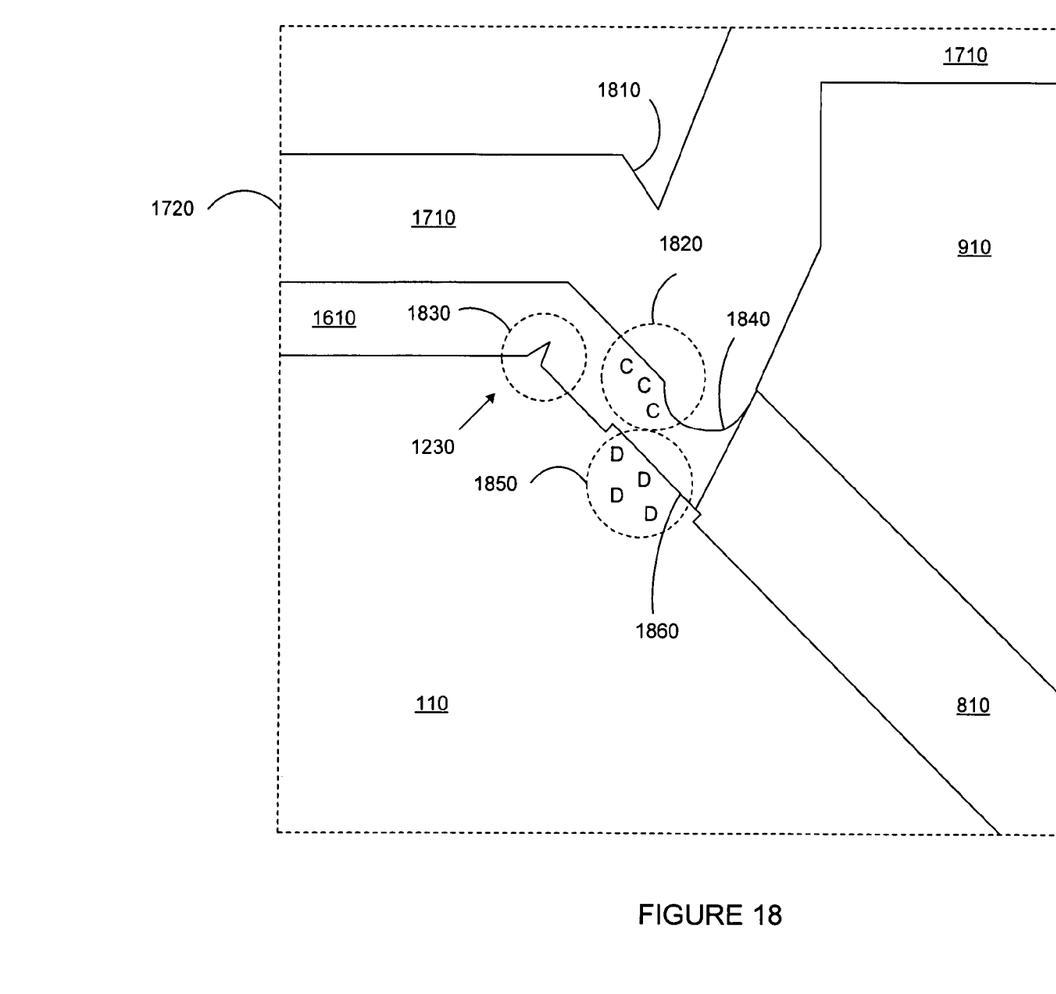
FIG. 18 illustrates an enlarged view of a portion of FIG. 17 enclosed in dotted outline.

To better understand some of the problems that are associated with the manufacturing process we now consider the portion of the structure 1720 that is enclosed in dotted outline in FIG. 17. An enlarged view of the portion of the structure 1720 is shown in FIG. 18. A number of possible problems may exist. Each of the possible problems may degrade the integrity of the gate oxide layer 1610.

A notch 1810 as shown in FIG. 18 may be formed in the upper surface of polysilicon layer 1710 due to the differential oxidation rate on the convex surface of the polysilicon layer 1710. The dotted circle 1820 encloses three letters "C". The letters "C" represent oxide weakness in the gate oxide layer 1610 that is caused by contaminating elements that are trapped in the gate oxide layer 1610 near the notch 1840 in the gate oxide layer 1610. Oxide weakness due to the contaminating elements may degrade the integrity of gate oxide layer 1610.

The dotted circle 1830 is located at the corner 1230 of silicon substrate 110. Dotted circle 1830 indicates the location of a high field area that is created where the silicon 110 extends into the gate oxide layer 1610 at the corner 1230. Such a high field may also degrade the integrity of gate oxide layer 1610.

The curved surface of notch 1840 represents thinning of the gate oxide layer 1610 that is caused by stress from the deposition of polysilicon layer 1710. Gate oxide thinning from this source may also degrade the integrity of gate oxide layer 1610.

The dotted circle 1850 encloses four letters "D". The letters "D" represent silicon damage in silicon 110 caused by the interaction between carbon from TEOS and silicon. Silicon damage in silicon 110 may also degrade the integrity of gate oxide layer 1610.

The surface 1860 represents thinning of the gate oxide layer 1610 that is caused by a silicon-carbide-oxynitride film that is similar to Kooi ribbon but that is created with the carbon from the TEOS. The gate oxide thinning from this source may also degrade the integrity of gate oxide layer 1610.

The actual physical or chemical mechanism by which the application of a pre-gate plasma etch process 1410 improves the integrity of the gate oxide layer 1610 is not clear. The pre-gate plasma etch mechanism may include one or more of the following:

(1) removal of a notch 1840 that is generated by a differential oxidation rate of a convex corner of polysilicon 1710, or (2) removal of contaminating elements located within gate oxide layer 1610 near the notch 1840, or (3) removal of stress from the sacrificial oxide/liner oxide layer at the gate/liner interface, or (4) removal of damaged silicon created by interaction between silicon and carbon from TEOS, or (5) removal of an oxidation blocking silicon-carbide-oxynitride ($Si_wC_xO_yN_z$) film similar to a Kooi ribbon, or (6) removal of a high field area 1830 at a corner of said silicon substrate.

Figure 19:
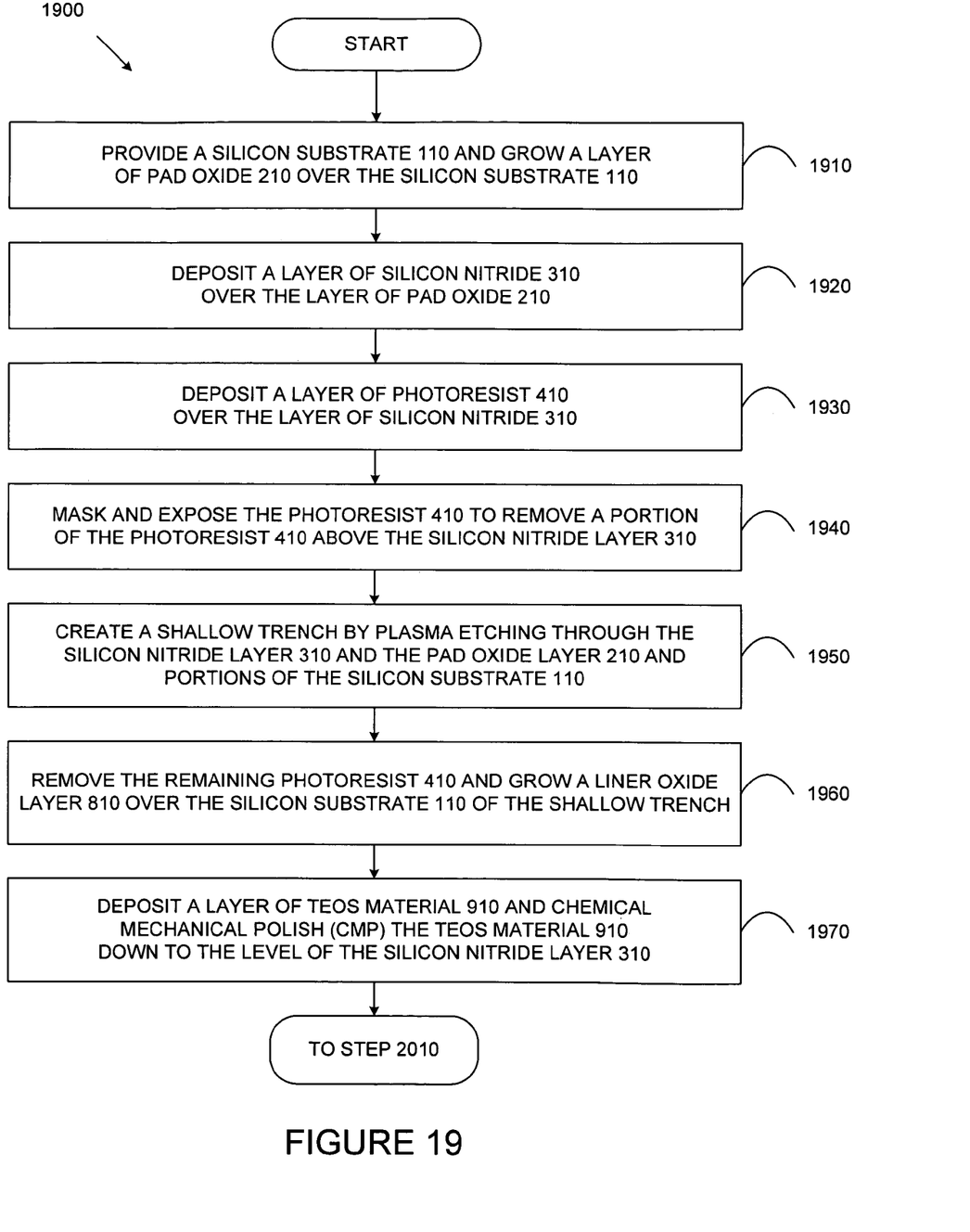
FIG. 19 illustrates a flow chart showing the steps of an advantageous embodiment of a first portion of the method of the present invention.

FIG. 19 illustrates a flow chart 1900 showing the steps of an advantageous embodiment of a first portion of the method of the present invention. In the first step of the method a silicon substrate 110 is provided and a layer of pad oxide 210 is grown over the silicon substrate 110 (step 1910). Then a layer of silicon nitride 310 is deposited over the layer of pad oxide 210 (step 1920). Then a layer of photoresist 410 is deposited over the layer of silicon nitride 310 (step 1930).

Then the layer of photoresist 410 is masked and exposed to remove a portion of the photoresist 410 above the silicon nitride layer (step 1940). Then a shallow trench is created by plasma etching through the silicon nitride layer 310 and through the pad oxide layer 210 and through portions of the silicon substrate 110 (step 1950). Then the remaining photoresist 410 is removed and a liner oxide layer 810 is grown over the silicon substrate 110 of the shallow trench (step 1960). A layer of TEOS material 910 is then deposited and the TEOS material 910 is chemical mechanical polished down to the level of the silicon nitride layer 310 (step 1970). Control of the method then passes to step 2010 of FIG. 20.

Figure 20:
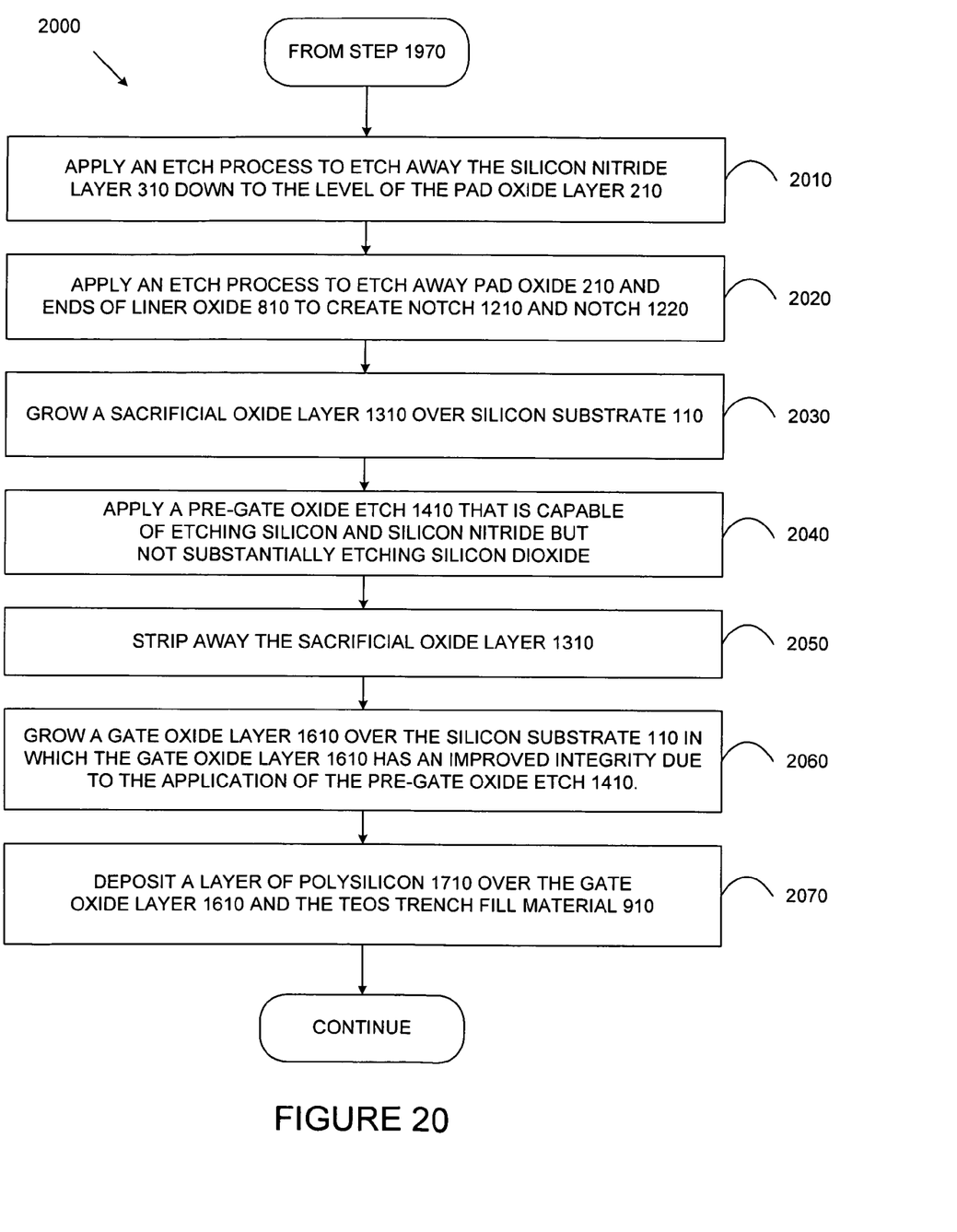
FIG. 20 illustrates a flow chart showing the steps of an advantageous embodiment of a second portion of the method of the present invention.

FIG. 20 illustrates a flow chart 2000 showing the steps of an advantageous embodiment of a second portion of the method of the present invention. Control of the method passes to step 2010 from step 1970 of FIG. 19. An etch process is applied to etch away the silicon nitride layer 310 down to the level of the pad oxide layer 210 (step 2010). Then an etch process is applied to etch away the pad oxide layer 210 and the ends of the liner oxide layer 810 to create notch 1210 and notch 1220 (step 2020). Then a sacrificial oxide layer 1310 is grown over silicon substrate 110 (step 2030).

Then a pre-gate plasma etch process 1410 is applied that is capable of etching silicon and silicon nitride but not substantially etching silicon dioxide (step 2040). Then the sacrificial oxide layer 1310 is stripped away (step 2050). Then a gate oxide layer 1610 is grown over the silicon substrate 110 (step 2060). The gate oxide layer 1610 has an improved integrity due to the application of the pre-gate plasma etch process 1410. Lastly, a layer of polysilicon 1710 is deposited over the gate oxide layer 1610 and the TEOS trench fill material 910 (step 2070).

Although the present invention has been described with an exemplary embodiment, various changes and modifications may be suggested to one skilled in the art. It is intended that the present invention encompass such changes and modifications as fall within the scope of the appended claims.

What is claimed is:

1. A method for manufacturing a gate oxide layer during a manufacturing process of a semiconductor device, said method comprising the steps of:
   growing a sacrificial oxide layer over a silicon substrate;
   applying a pre-gate plasma etch process to said sacrificial oxide layer that does not substantially remove said sacrificial oxide layer;
   stripping away said sacrificial oxide layer from said silicon substrate; and
   growing said gate oxide layer over said silicon substrate.

2. The method as set forth in claim 1 wherein said pre-gate plasma etch process is capable of etching silicon and silicon nitride at an etch rate that does not substantially etch silicon dioxide.

3. The method as set forth in claim 1 wherein portions of said silicon substrate form a corner at an edge of a shallow trench etched within said silicon substrate.

4. The method as set forth in claim 1 wherein said step of applying said pre-gate plasma etch process reduces stress in said gate oxide layer.

5. The method as set forth in claim 1 further comprising a step of growing a layer of polysilicon over said gate oxide layer.

6. The method as set forth in claim 5 wherein said step of applying said pre-gate plasma etch process by preventing formation of a notch in said gate oxide layer.

7. The method as set forth in claim 5 wherein said step of applying said pre-gate plasma etch process prevents formation of contaminating elements located within a notch located within said gate oxide layer.

8. The method as set forth in claim 7 wherein said step of preventing formation of contaminating elements located within said notch in said gate oxide layer prevents weakness from occurring in said gate oxide layer.

9. The method as set forth in claim 5 wherein said step of applying said pre-gate plasma etch process prevents formation of damaged silicon in said silicon substrate.

10. The method as set forth in claim 5 wherein said step of applying said pre-gate plasma etch process prevents formation of an oxidation blocking silicon-carbide-oxynitride film.

11. The method as set forth in claim 5 wherein said step of applying said pre-gate plasma etch process prevents formation of a high field area at a corner of said silicon substrate.

12. A method for manufacturing a gate oxide layer during a manufacturing process of a shallow trench in a semiconductor device, said method comprising the steps of:
    etching a shallow trench in a silicon substrate;
    growing a liner oxide layer over said silicon substrate of said shallow trench;
    depositing a layer of tetra-ethyl-oxysilane (TEOS) material in said shallow trench;
    chemical mechanical polishing said TEOS material to a desired level;
    growing a sacrificial oxide layer over surfaces of said silicon substrate not covered by said TEOS material;
    applying a pre-gate plasma etch process to said sacrificial oxide layer that does not substantially remove said sacrificial oxide layer;
    stripping away said sacrificial oxide layer from said silicon substrate; and
    growing said gate oxide layer over said silicon substrate.

13. The method as set forth in claim 12 wherein said pre-gate plasma etch process is capable of etching silicon and silicon nitride at an etch rate that does not substantially etch silicon dioxide.

14. The method as set forth in claim 12 wherein portions of said silicon substrate form a corner at an edge of said shallow trench etched within said silicon substrate.

15. The method as set forth in claim 12 wherein said step of applying said pre-gate plasma etch process reduces stress between said gate oxide layer and said liner oxide layer.

16. The method as set forth in claim 12 further comprising a step of growing a layer of polysilicon over said gate oxide layer and over said TEOS material within said shallow trench.

17. The method as set forth in claim 16 herein said step of applying said pre-gate plasma etch process prevents formation of a notch in said gate oxide layer.

18. The method as set forth in claim 16 wherein said step of applying said pre-gate plasma etch process prevents formation of contaminating elements located within a notch in said gate oxide layer.

19. The method as set forth in claim 18 wherein said step of preventing formation of contaminating elements located within said notch in said gate oxide layer prevents weakness from occurring in said gate oxide layer.

20. The method as set forth in claim 16 wherein said step of applying said pre-gate plasma etch process prevents formation of damaged silicon in said silicon substrate.

21. The method as set forth in claim 16 wherein said step of applying said pre-gate plasma etch process prevents formation of an oxidation blocking silicon-carbide-oxynitride film.

22. The method as set forth in claim 16 wherein said step of applying said pre-gate plasma etch process prevents formation of a high field area at a corner of said silicon substrate.

* * * * *